United States Patent [19]

Nelson

[11] Patent Number: 4,531,233
[45] Date of Patent: Jul. 23, 1985

[54] VARIABLE INCREMENT TUNING SELECT

[75] Inventor: David A. Nelson, Cedar Rapids, Iowa

[73] Assignee: Rockwell International Corporation, El Segundo, Calif.

[21] Appl. No.: 493,902

[22] Filed: May 12, 1983

[51] Int. Cl.³ ............................................. H04B 1/26
[52] U.S. Cl. .................................... 455/173; 455/182
[58] Field of Search .................. 455/76, 77, 158, 173, 455/182, 192, 170; 377/17, 55; 307/122

[56] References Cited

U.S. PATENT DOCUMENTS 4,263,581 4/1981 Okatani et al. .................... 455/170
4,281,415 7/1981 Rock, Jr. ............................. 455/173
4,404,531 9/1983 Genrich et al. ..................... 455/165

*Primary Examiner*—Marc E. Bookbinder
*Attorney, Agent, or Firm*—Robert C. Mayes; George A. Montanye; H. Fredrick Hamann

[57] ABSTRACT

A tuning control for an aircraft radio apparatus is disclosed for a variety of applications wherein a single control provides a coarse tuning increment and, having the direction of movement of the control sensed, changes to a finer tuning increment as a function of changes in the direction of rotation of the tuning knob. The control frequency will change by twice the smallest frequency interval for each switch detent, until the direction of a knob rotation is opposite to that of the previous rotation. At that point the frequency will change by the smallest interval for the first detent position and thereafter to the next even interval for subsequent rotations in the same direction. This allows a single knob to be capable of providing both a rapid traverse over the spectrum of use, and still provide ready access to the smallest intervals of the spectrum.

1 Claim, 2 Drawing Figures

VARIABLE INCREMENT TUNING SELECT

BACKGROUND OF THE INVENTION

This invention relates to electronics in general, and more particularly, to tuning controls for digital equipment having selectable frequencies of operation.

The advent of digital techniques on radio communications has been significant in recent years, most notably in the increased reliability and precision capable of being attained utilizing the new technology.

A digital radio system will normally be operated in an incremental frequency select mode of operation with the frequency increments matching the required conventions of the spectrum of use. The frequencies are typically selected by utilizing a knob having a plurality of selectable detent positions wherein each position provides a specified digital input to a digital processor resulting in singular frequency output matching the detent position of the switch.

The normal switch input implementation utilizes two frequency select knobs, wherein a first coarse adjustment knob is utilized for rapidly changing the frequency at relatively coarse increments and a second fine increment knob for tuning in between the coarse increments of the first knob. This requires the use of two switches at the very least, and in alternative implementations, a numeric input pad is used requiring at least ten switches for inputting each of the ten digits as desired.

A variety of methods for tuning have been described in the U.S. Pat. No. 3,843,873 issued to Robert E. Beville, Oct. 22, 1974, entitled "Counter Having Selective Direction and Variable Rate Control", U.S Pat. No. 4,309,598, issued Jan. 5, 1982 to James M. Davis, Jr., entitled "Variable Rate Data Entry Apparatus and Method", and the U.S. Pat. No. 4,036,431, issued July 19, 1977 to Lars F. Gidlof, entitled "Method and Apparatus for Use in Setting a Counter". Those patents provide useful background and are hereby incorporated by reference thereto the Davis patent referenced above describes an alternative hardware/software embodiment which facilitates ready application of the instantly disclosed software in its own alternative hardware embodiment. Specific reference is made to Davis FIGS. 1, 3, 4a and 4b and the associated discussion in columns 2-9 for a hardware embodiment and to FIGS. 8, 9 and their associated discussion in columns 9-17 for an alternative software embodiment.

SUMMARY AND BRIEF DESCRIPTION OF THE INVENTION

Accordingly, it is an object of the present invention to reduce the number of switches required in a digital variable frequency apparatus.

Another object of the present invention is to provide a rapid means of changing frequencies in a variable frequency apparatus utilizing a single control and retain the capability of selecting the smallest increment desired.

A yet further object of the present invention is to provide a tuning control for an aircraft having an improved frequency selection characteristic, for a digital variable frequency system, and having a reduced cost and weight.

Briefly, and in accordance with the present invention, a variable increment tuning control comprises an input means having two directions of movement for inputting a commanding data input, means for sensing a change between one of the directions of movement to the other, coupled to the input means, and means for operating control in an incremental manner as a function of sensed change in direction to modify the value of the increments. By sensing the change in direction of the input means, normally a rotational tuning knob, the value of the increments of change of the commanded frequency is reduced to the smallest increment desired. These smaller increments are maintained for a predetermined amount of motion, typically two detents, and then returned to the normal "coarse" incremental change mode of operation.

As the knob is turned in a first direction, either clockwise (normally to increment frequency) or counterclockwise (normally to decrement frequency) the processor operates in a coarse mode of frequency incrementation resulting in, for example, a 50 kHz increment in an aircraft VHF communication radio, until the direction of rotation is changed. At this point, the change of direction of rotation results, in one implementation, in a change to a 25 kHz increment for two detent positions. If a third detent position is selected in the same direction, the processor reverts back to the 50 kHz increment. In this manner, it can be seen that the operator has both a rapid method of traversing through the spectrum of use without going through each of the available frequencies, and yet has ready access to any desired frequency by changing the direction of rotation of the knob.

The present invention finds ready implementation in avionics equipment wherein the need for reduced cost and weight of the equipment as well as the paramount need for a human factors engineered apparatus is required. The present invention is incorporated in aircraft cockpit equipment easily and is convenient to use during normal circumstances as well as adapted to rapid frequency location during any potential emergencies.

Other novel features of the invention will be apparent upon reading the detailed description in conjunction with the accompanying drawings in which.

DETAILED DESCRIPTION OF THE DRAWINGS

Figure 1:
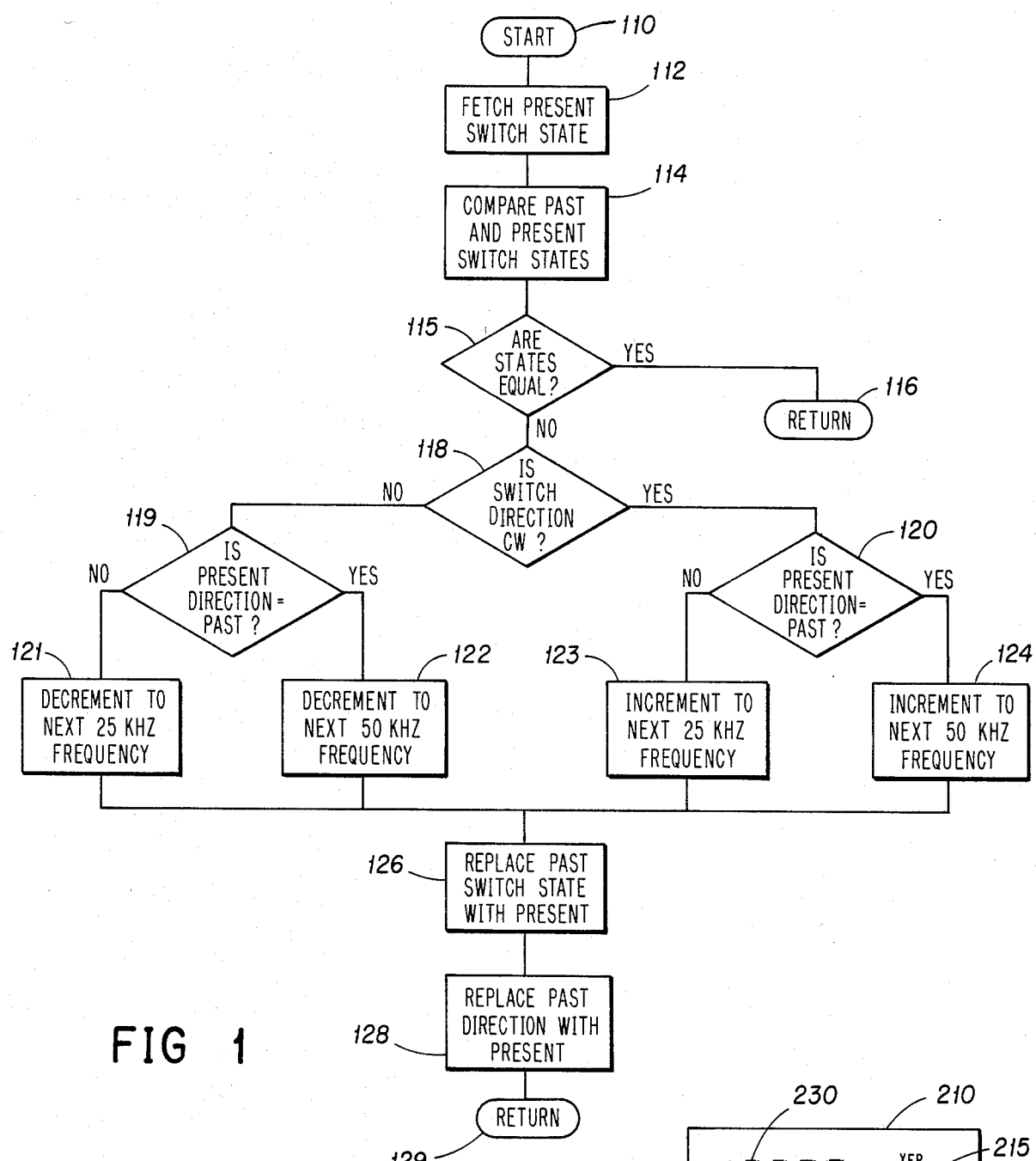
FIG. 1 is a flow chart showing one implementation of a tuning control method of operation in accordance with the present invention.

Referring now to FIG. 1, a flow diagram showing the mode of operation of the present invention is disclosed beginning with the start position 110 for the increment select routine. The processor fetches the present switch state at block 112, then compares at block 114 the past and present switch states to determine at block 115 if the states are equal. If so, meaning that the knob has not been turned, then the subroutine returns at block 116 to the regular operation of the digital processor in the unit. If however, since the previous interrogation, the states are not equal, the question is then asked at block 118, is the switch direction of rotation clockwise?. In actual implementation, a three position switch is utilized such that the first position is known by the processor and therefore the next position switched clockwise or counterclockwise determines the direction of rotation of the switch and additionally relates the new position information. If the switch direction is clockwise, the next inquiry as represented by block 120 is asked: is the present direction equal to the past direction of turn?. If yes, then block 124 is the proper functional block to relate to the processor the information required to increment to the next 50 kHz frequency interval, in this exemplary embodiment. If not, then the processor is commanded through block 123 to increment to the next 25 kHz frequency.

Alternatively, if the switch direction is counterclockwise, then block 119 represents the inquiry: is the present direction equal to the past?. If so, then the function block 122 is utilized to decrement to the next 50 kHz frequency, and alternatively, if the direction of rotation is different from the last direction, block 121 commands a decrement to the next 25 kHz frequency. In this manner, it can be seen that the change of direction of the switch controls the increment selection from a coarse to a fine frequency interval. Thereafter, at block 126, the new information with respect to the switch position is updated and at block 128 the new information with respect to switch direction is updated. Thereafter, the subroutine at block 129 returns operation to the processor for other functions.

The implementation of this flow diagram is readily implemented in software or may be readily implemented in hard-wired logic in essentially a decisional switching network.

In a preferred embodiment, the software is implemented in a ROM provided in the digital radio system as a subroutine for controlling frequency selection input manually by the tuning select knob.

Figure 2:
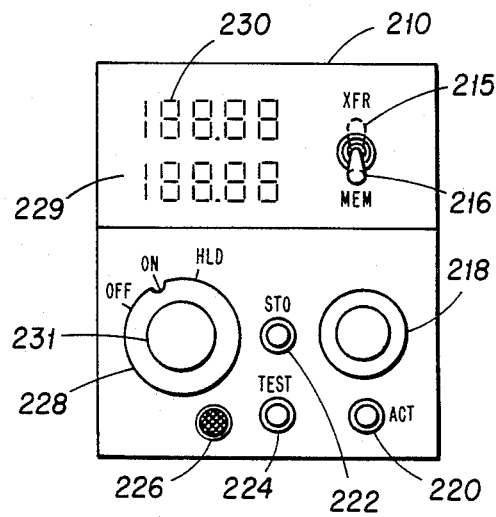
FIG. 2 is a tuning control having a variable increment tuning select as disclosed and described herein.

Referring now to FIG. 2, a front panel of a tuning control in accordance with the present invention is shown wheren 210 is the front facing panel as is displayed to a pilot of an aircraft. The segmented annunciator region 230 is utilized for communicating the active radio frequency and diagnostic information and the lower display 229 is utilized for displaying the preset frequency in an embodiment having a presettable or memory capability. The toggle switch position 215 is utilized to transfer preset frequency to active display 40 and the toggle switch 216 is utilized to load the frequency from memory as well as advance memory to the next location in a multiposition memory capable radio. Frequency selection knobs 218 control the variable increment capability of the present invention and in a clockwise rotation, for example, maintains a 50 kHz increment in frequency increase while being turned clockwise until the knob is rotated in a counterclockwise position. At that point, the knob 218 through the operation of the flow diagram shown in FIG. 1, operates to decrement the frequency on active display 230 at 25 kHz increments until the third detent of knob 218 and then returns to a 50 kHz decrement for each detent thereafter. Active button 220 selects whether active or preset frequency display is changed by the knobs, and the store button 222 displays location number of available memory or stores preset frequency in available memory. The self-test button 224 initiates self-test routine at the radio and the light sensor 226 automatically controls the brightness of displays 230 and 229. The power and mode switch 228 has an optional volume control 231 mounted thereon.

The control 218, in one embodiment, has two concentric rotary switches which are used to change the frequencies displayed in the display windows. The switch controlled by the outer knob controls the tens and units MHz digits, while the switch associated with the inner knob controls the tenths and hundredths MHz digits. Each detent of the switch increments (clockwise) or decrements (counterclockwise) the frequency by 1 MHz (outer knob) or 0.05 MHz (inner knob) with the exception that the first two detent positions following a change in rotational direction cause a 0.025 MHz change. Thus, the present invention is readily utilized to rapidly change frequency while simultaneously retaining the capability of tuning each of the intermediate frequencies as desired.

While the present invention has been described with reference to a specific implementation, it is not intended that the invention be so limited. In alternative embodiments, for example, an automatic direction finder (ADF) unit, the coarse incrementation and decrementation utilized is 1 kHz and the fine incrementation utilized is 0.5 kHz.

Various modifications of the illustrative embodiments, as well as other embodiments of the invention, will be apparent to persons skilled in the art upon reference to this description. It is therefore contemplated that the appended claims will cover any such modifications of embodiments as fall within the true scope of the invention.

What is claimed is:

1. A tuning control for a variable frequency apparatus in an aircraft comprising:
    a manual frequency selection switch means operable in an incremental selection manner and movable in two directions for providing each of a first frequency selection signal and a second frequency selection signal;
    processor controlled frequency selection means for providing tuning control signals to said variable frequency apparatus in response to said first and second frequency selection signals, said processor controlled frequency selection means comprising means to sense changes of movement direction during provision of said second frequency selection signal to provide a variable incremental value signal therefor as a function of said changed movement direction, and said processor controlled frequency selection means providing said tuning control signals from said first frequency selection signal and said variable increment value signal.

* * * * *